(12) United States Patent
Baek et al.

(10) Patent No.: US 11,910,679 B2
(45) Date of Patent: Feb. 20, 2024

(54) METHOD OF MANUFACTURING DISPLAY PANEL WITH CIRCUIT-LAYER STACK INCLUDING METAL, OXIDE, AND CAPPING LAYERS, AND DISPLAY PANEL MANUFACTURED BY THE SAME

(71) Applicant: Samsung Display Co., Ltd., Yongin-Si (KR)

(72) Inventors: Gyungmin Baek, Yongin-si (KR); Juhyun Lee, Seongnam-si (KR); Hongsick Park, Suwon-si (KR); Hyuneok Shin, Gwacheon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/121,646

(22) Filed: Mar. 15, 2023

(65) Prior Publication Data

US 2023/0232681 A1    Jul. 20, 2023

Related U.S. Application Data

(62) Division of application No. 17/026,604, filed on Sep. 21, 2020, now Pat. No. 11,637,167.

(30) Foreign Application Priority Data

Jan. 17, 2020   (KR) .................. 10-2020-0006533

(51) Int. Cl.
*H10K 59/131*    (2023.01)
*H10K 71/00*    (2023.01)
(Continued)

(52) U.S. Cl.
CPC .......... *H10K 59/131* (2023.02); *H10K 71/00* (2023.02); *H10K 50/844* (2023.02); *H10K 59/1201* (2023.02)

(58) Field of Classification Search
CPC .. H10K 59/12; H10K 59/1201; H10K 59/131; H10K 71/00; H10K 71/40; H10K 71/421; H10K 71/441; H01L 27/124
(Continued)

(56) References Cited

U.S. PATENT DOCUMENTS 9,318,510 B2 *   4/2016   Kim .................. H01L 27/1244
10,386,687 B2 *   8/2019   Yang .................. H01L 27/124
(Continued)

FOREIGN PATENT DOCUMENTS

CN   106972027   7/2017
CN   106997892   8/2017
(Continued)

OTHER PUBLICATIONS

CRC Handbook of Metal Etchants. United States, CRC Press, 1990. (Year: 1990).

*Primary Examiner* — Matthew E. Gordon
(74) *Attorney, Agent, or Firm* — F. Chau & Associates, LLC

(57) ABSTRACT

A method of manufacturing a display panel includes forming a circuit layer including a gate, a source, and a drain on a base substrate and forming a light emitting element layer on the circuit layer. The forming of the circuit layer includes sequentially forming a preliminary metal layer, a preliminary oxide layer comprising molybdenum and tantalum, and a preliminary capping layer which comprise a preliminary electrode layer, cleaning the preliminary electrode layer, forming a photoresist layer pattern on the preliminary electrode layer, etching the preliminary electrode layer, and removing the photoresist layer pattern. During the etching of the preliminary electrode layer, a ratio between a removal speed $ER_1$ of the preliminary oxide layer and a removal speed $ER_2$ of the preliminary metal layer satisfies Equation 1 to maintain a low reflection property $1 \leq ER_2/ER_1 \leq 3$.   [Equation 1]

9 Claims, 11 Drawing Sheets

(51) Int. Cl.
*H10K 50/844* (2023.01)
*H10K 59/12* (2023.01)

(58) Field of Classification Search
USPC .................................................. 257/40, 66
See application file for complete search history.

(56) References Cited

U.S. PATENT DOCUMENTS

| | | | |
|---|---|---|---|
| 2019/0004616 A1* | 1/2019 | Baek | G06F 3/0446 |
| 2020/0052055 A1* | 2/2020 | Song | H10K 59/1213 |
| 2020/0144306 A1* | 5/2020 | Wang | H10K 59/123 |
| 2021/0225988 A1 | 7/2021 | Baek et al. | |
| 2021/0288122 A1* | 9/2021 | Kim | H10K 71/20 |

FOREIGN PATENT DOCUMENTS

| | | |
|---|---|---|
| KR | 10-2015-0034947 | 4/2015 |
| KR | 10-2019-0003905 | 1/2019 |
| KR | 10-2019-0031393 | 3/2019 |

* cited by examiner

METHOD OF MANUFACTURING DISPLAY PANEL WITH CIRCUIT-LAYER STACK INCLUDING METAL, OXIDE, AND CAPPING LAYERS, AND DISPLAY PANEL MANUFACTURED BY THE SAME

CROSS-REFERENCE TO RELATED APPLICATIONS

This application is a divisional of U.S. patent application Ser. No. 17/026,604 filed on Sep. 21, 2020, which claims priority under 35 U.S.C. § 119 to Korean Patent Application No. 10-2020-0006533, filed on Jan. 17, 2020 in the Korean Intellectual Property Office, the disclosures of which are incorporated by reference in their entireties herein.

1. TECHNICAL FIELD

The present inventive concepts relate to a method of manufacturing a display panel and a display panel, and more particularly, to a method of manufacturing a display panel having a low reflection property and a display panel manufactured by the same.

2. DISCUSSION OF RELATED ART

A display device includes signal lines for displaying an image or detecting an external signal and electronic elements connected to the signal lines. The signal lines and the electronic elements may be included in a conductive layer. Since the conductive layer includes metal that has a relatively high reflectivity, external light may be reflected by the conductive layer and the conductive layer may be visible to the viewer from the outside. When the signal lines or the electronic element are visible from the outside by the viewer due to the reflection of the external light, there may be a decrease in the visibility and quality of an image displayed by the display device.

SUMMARY

The present inventive concepts provide a method of manufacturing a display panel maintaining a low reflection property and a display panel manufactured by the same.

In an exemplary embodiment of the present inventive concepts, a method of manufacturing a display panel includes forming a circuit layer including a gate, a source, and a drain on a base substrate. A light emitting element layer is formed on the circuit layer. The forming of the circuit layer comprises forming a preliminary metal layer. A preliminary oxide layer comprising molybdenum and tantalum is formed on the preliminary metal layer. A preliminary capping layer comprising at least one compound selected from AZO GZO, ITZO, IZO, ZIO, and ZTO is formed on the preliminary oxide layer. A preliminary electrode layer comprising the preliminary metal layer, the preliminary oxide layer, and the preliminary capping layer is cleaned. A photoresist layer pattern is formed on the preliminary electrode layer. The preliminary electrode layer on which the photoresist layer pattern is formed is etched to form a metal layer, oxide layer and capping layer from the preliminary metal layer, the preliminary oxide layer and the preliminary capping layer, respectively. The photoresist layer pattern is removed. During the etching of the preliminary electrode layer, a ratio between a removal speed $ER_1$ of the preliminary oxide layer and a removal speed $ER_2$ of the preliminary metal layer satisfies Equation 1.

$$1 \leq ER_2/E_1 \leq 3 \quad \text{[Equation 1]}$$

In Equation 1, $ER_1$ and $ER_2$ are removal speeds of the preliminary oxide layer and the preliminary metal layer in the same unit area, respectively.

In an exemplary embodiment, the etching may include providing a non-hydro-peroxide etching solution.

In an exemplary embodiment, the preliminary capping layer may be provided to cover the preliminary oxide layer and the preliminary metal layer.

In an exemplary embodiment, each of the AZO, GZO, ITZO, IZO, ZIO, and ZTO may be an amorphous conductive metal oxide.

In an exemplary embodiment, the preliminary capping layer may have a mean reflectivity of about 20% or less in a wavelength region of about 400 nm or more and about 800 nm or less.

In an exemplary embodiment, the preliminary capping layer may have a thickness of about 100 Å or more and about 1000 Å or less.

In an exemplary embodiment, the preliminary capping layer may have a transmittance of about 90% or more in a wavelength region of about 400 nm or more and about 800 nm or less.

In an exemplary embodiment, a content ratio of the molybdenum and the tantalum may be about 94:6 to about 98:2.

In an exemplary embodiment, the preliminary oxide layer may have a thickness of about 100 Å or more and about 1500 Å or less.

In an exemplary embodiment, the preliminary metal layer may be a single layer including Cu or Al or multilayers including Cu/Ti, Al/Ti, or Ti/Al/Ti.

In an exemplary embodiment, the light emitting element layer may include: a first electrode and a second electrode, which face each other; and a light emitting layer disposed between the first electrode and the second electrode.

In an exemplary embodiment of the present inventive concepts, a display panel includes a base substrate. A circuit layer is disposed on the base substrate and comprises a gate, a source, and a drain. A light emitting element layer is disposed on the circuit layer. At least one of the gate, the source, and the drain comprises a metal layer, an oxide layer disposed on the metal layer and comprising molybdenum and tantalum and a capping layer disposed on the oxide layer and comprising at least one compound selected from AZO, GZO, ITZO, IZO, ZIO, and ZTO.

BRIEF DESCRIPTION OF THE DRAWINGS

The accompanying drawings are included to provide a further understanding of the present inventive concepts, and are incorporated in and constitute a part of this specification. The drawings illustrate exemplary embodiments of the present inventive concepts and, together with the description, serve to explain principles of the inventive concepts. In the drawings.

DETAILED DESCRIPTION OF EXEMPLARY EMBODIMENTS

Figure 1:
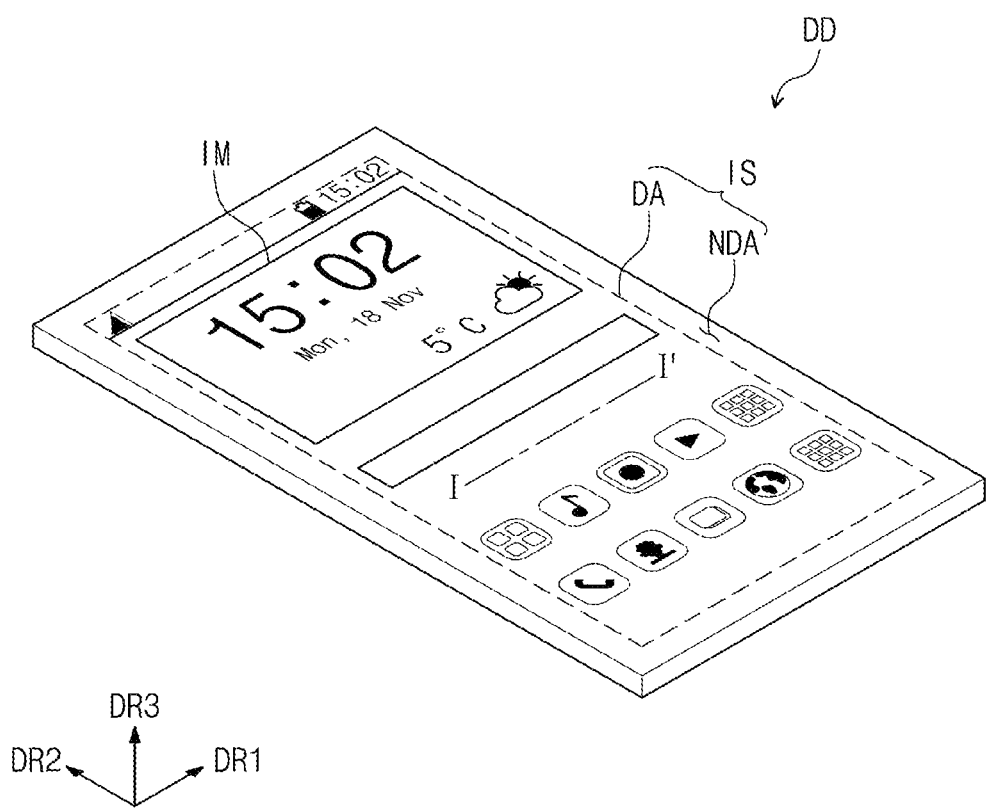
FIG. 1 is a perspective view illustrating a display device according to an exemplary embodiment of the present inventive concepts.

Exemplary embodiments of the present inventive concepts are illustrated in the drawings and are described in the detailed description of exemplary embodiments. However, the present inventive concepts are not limited by the specific exemplary embodiments described herein and the present inventive concepts may have diverse modified embodiments. Therefore, it should be understood that the present inventive concepts cover all modifications, equivalents, and replacements within the idea and technical scope of the present inventive concepts.

In this specification, it will also be understood that when one component (or region, layer, portion) is referred to as being 'on', 'connected to', or 'coupled to' another component (or region, layer, portion), it can be directly disposed/connected/coupled on/to the one component, or an intervening third component may also be present.

In this specification, it will be understood that when a layer, a film, a region, or a plate is in "direct contact" with another layer, film, region, or plate, another layer, film, region, or plate is not present therebetween.

Like reference numerals refer to like elements throughout. Also, in the figures, the thickness, ratio, and dimensions of components are exaggerated for clarity of illustration and exemplary embodiments of the present inventive concepts are not limited thereby.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the present inventive concepts. The terms of a singular form may include plural forms unless referred to the contrary.

The terms "under", "below", "above", "upper", and the like are used for explaining a relation association of components illustrated in the drawings. The terms may be a relative concept and described based on directions expressed in the drawings. It will also be understood that when a layer (or film) is referred to as being 'on' another layer or substrate, it can be disposed above or below the other layer or substrate.

Unless otherwise defined, all terms including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, a display panel according to an exemplary embodiment of the present inventive concepts and a method of manufacturing the same will be described.

Figure 2:
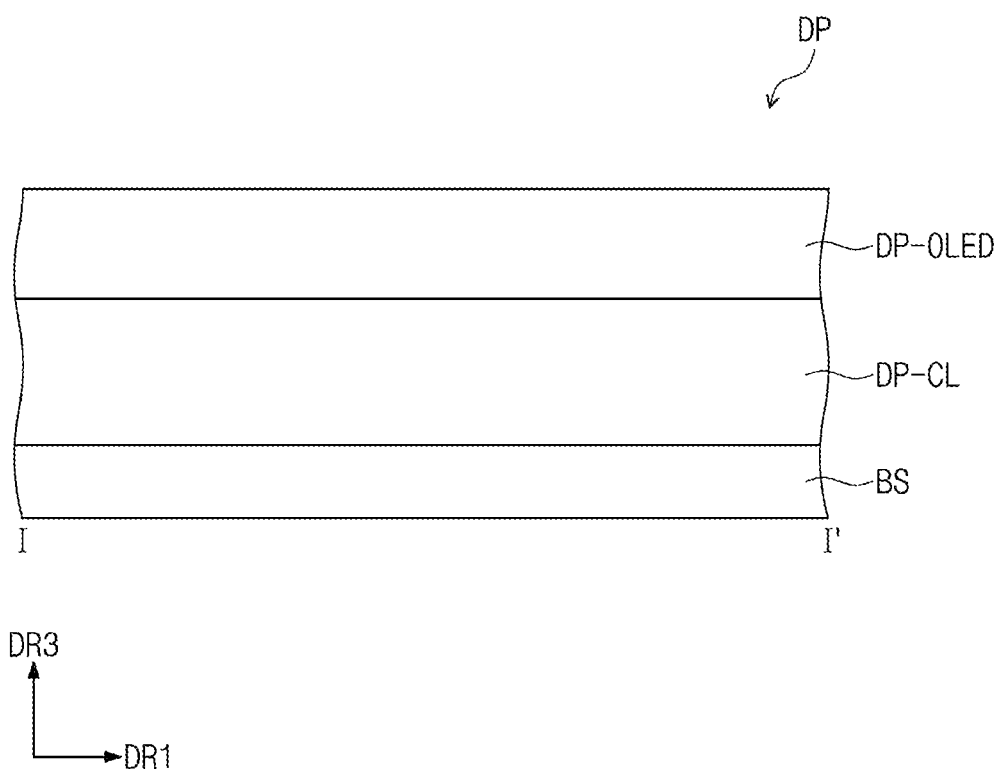
FIG. 2 is a cross-sectional view taken along line I-I' of FIG. 1 according to an exemplary embodiment of the present inventive concepts.

FIG. 1 is a perspective view illustrating a display device DD, and FIG. 2 is a cross-sectional view illustrating a display panel according to exemplary embodiments of the present inventive concepts. FIG. 2 is a cross-sectional view taken along line I-I' of FIG. 1.

The display panel DP according to an exemplary embodiment may be included in the display device DD. For example, the display device DD may be used for large-sized electronic devices such as televisions, monitors, and electronic billboards or small and medium-sized electronic devices such as personal computers, notebook computers, personal digital terminals, navigation units for vehicles, game consoles, smartphones, tablet computers, and cameras. However, exemplary embodiments of the present inventive concepts are not limited to the above-described display devices and the display panel DP may be included in other electronic devices without departing from the spirit and scope of the present inventive concepts.

The display surface IS includes a display area DA on which an image IM is displayed and a non-display area NDA disposed adjacent to the display area DA. The non-display area NDA may be an area on which an image is not displayed. In the exemplary embodiment of FIG. 1, a clock window and application icons are illustrated as an example of the image IM. However, the image IM may include one or more still and/or moving images of various different forms.

As shown in the exemplary embodiment of FIG. 1, the display area DA may have a rectangular shape. The non-display area NDA may surround the display area DA. For example, as shown in the exemplary embodiment of FIG. 1, the non-display area NDA surrounds all four sides of the rectangular-shaped display area DA. However, exemplary embodiments of the present inventive concepts are not limited thereto and the shapes of the display area DA and the non-display area NDA may be relatively designed. For example, the display area DA may have various different polygonal shapes, circular shapes, irregular shapes or three-dimensional shapes and in some exemplary embodiments the non-display area NDA may not surround at least one side of the display area DA. Additionally, in some exemplary embodiments, the display surface IS may not include the non-display area NDA.

As shown in the exemplary embodiment of FIG. 2, the display panel DP may include a base substrate BS, a circuit layer DP-CL disposed on the base substrate BS, and a light emitting element layer DP-OLED disposed on the circuit layer DP-CL. For example, the base substrate BS, circuit layer DP-CL and light emitting element layer DP-OLED may be consecutively stacked in a third direction DR3 that is perpendicular to an upper surface of the base substrate BS. In an exemplary embodiment, the light emitting element layer DP-OLED may be an organic electric field light emitting element including a light emitting layer disposed between electrodes facing each other. The light emitting layer may be an organic light emitting layer or a liquid crystal layer. However, exemplary embodiments of the present inventive concepts are not limited thereto.

In an exemplary embodiment, the base substrate BS may include at least one plastic film. In an exemplary embodiment, the base substrate BS may be a flexible substrate that includes a plastic substrate, a glass substrate, a metal substrate, or an organic/inorganic composite substrate.

Figure 11:
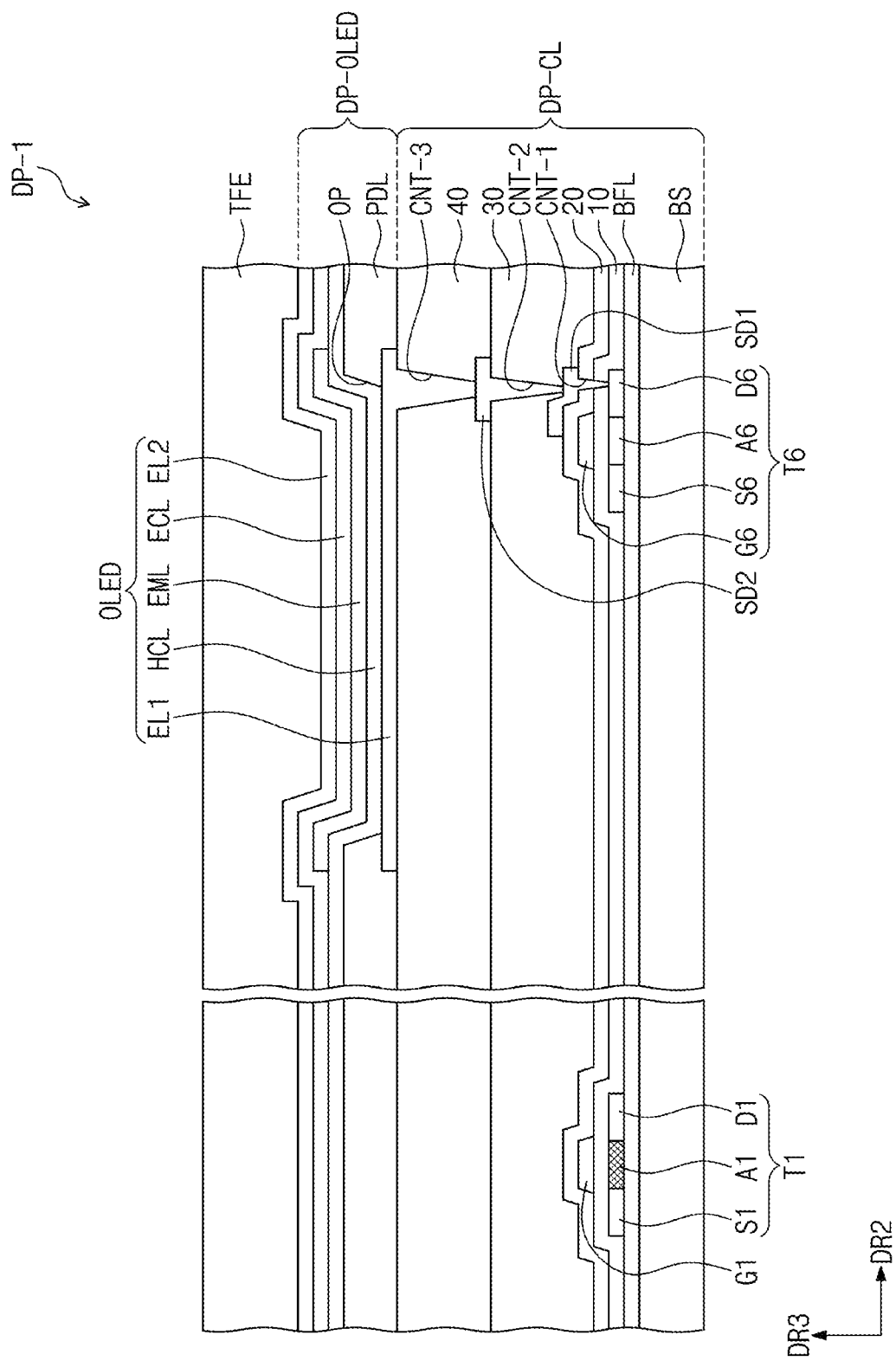
FIG. 11 is a cross-sectional view illustrating a display panel according to an exemplary embodiment of the present inventive concepts.

The circuit layer DP-CL may include first and sixth gates G1 and G6 (refer to FIG. 11), first and sixth sources S1 and S6 (refer to FIG. 11), and first and sixth drains D1 and D6 (refer to FIG. 11), which are illustrated in the exemplary embodiment of FIG. 11. At least one of the first and sixth gates G1 and G6 (refer to FIG. 11), the first and sixth sources S1 and S6 (refer to FIG. 11), and the first and sixth drains D1 and D6 (refer to FIG. 11) may include a metal layer MP (refer to FIG. 8), an oxide layer RP (refer to FIG. 8) disposed on the metal layer MP (refer to FIG. 8), and a capping layer CAP (refer to FIG. 8) disposed on the oxide layer RP (refer to FIG. 8). In an exemplary embodiment, the oxide layer RP may include a molybdenum oxide ($MoO_x$) and a tantalum oxide ($TaO_x$), and the capping layer CAP may include at least one compound selected from an aluminum-doped zinc oxide (AZO), a gallium doped zinc oxide (GZO), an indium tin zinc oxide (ITZO), an indium zinc oxide (IZO), an Indium doped zinc oxide (ZIO), and a zinc tin oxide (ZTO).

A method of manufacturing the display panel DP according to an exemplary embodiment may include: a process of forming the circuit layer DP-CL including the first and sixth gates G1 and G6, the first and sixth sources S1 and S6, and the first and sixth drains D1 and D6 on the base substrate BS; and a process of forming the light emitting element layer DP-OLED on the circuit layer DP-CL. In an exemplary embodiment of the present inventive concepts, the process of forming the circuit layer DP-CL may include: a process of forming a preliminary metal layer MP-P; a process of forming a preliminary oxide layer RP-P, a process of forming a preliminary capping layer CAP-P, and a process of cleaning a preliminary electrode layer EL-P including the preliminary metal layer MP-P, the preliminary oxide layer RP-P, and the preliminary capping layer CAP-P. The process of forming the circuit layer DP-CL may also include: a process of forming a photoresist layer pattern PT-P1 on the preliminary electrode layer EL-P; a process of etching the preliminary electrode layer EL-P on which the photoresist layer pattern PT-P1 is formed; and a process of removing the photoresist layer pattern PT-P1.

Figure 8:
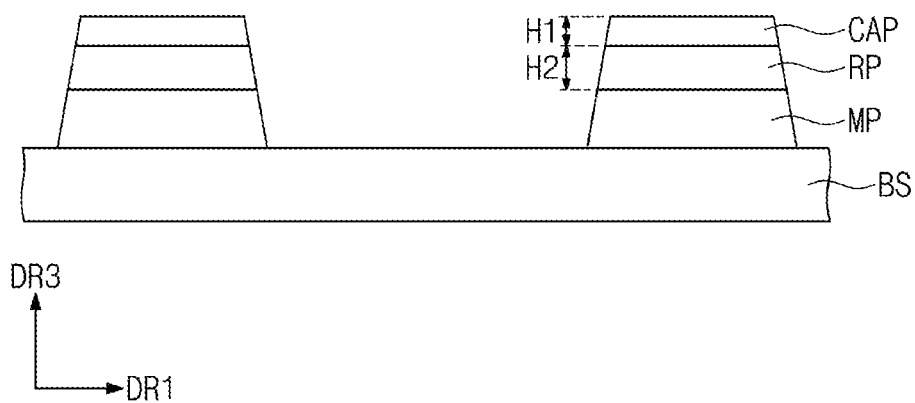
FIG. 8 is a cross-sectional view illustrating the method of manufacturing the display panel according to an exemplary embodiment of the present inventive concepts.

According to an exemplary embodiment of the present inventive concepts, at least one of the first and sixth gates G1 and G6 (refer to FIG. 11), the first and sixth sources S1 and S6 (refer to FIG. 11), and the first and sixth drains D1 and D0 (refer to FIG. 11) may include the metal layer MP (refer to FIG. 8), the oxide layer RP (refer to FIG. 8), and the capping layer CAP (refer to FIG. 8).

Figure 3:
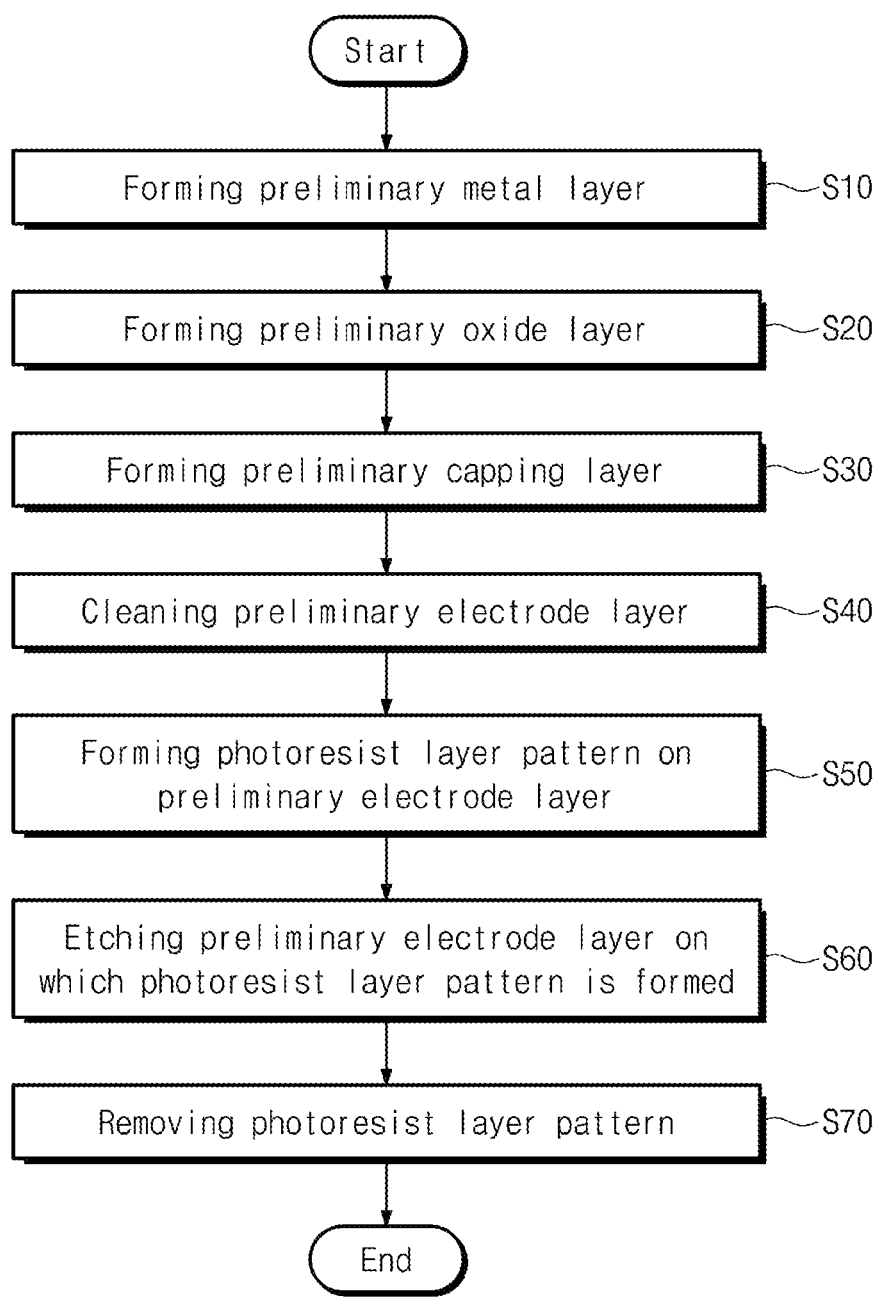
FIG. 3 is a flowchart representing one process of a method of manufacturing a display panel according to an exemplary embodiment of the present inventive concepts.

FIG. 3 is a flowchart representing a process of forming a portion of the circuit layer DP-CL of the method of manufacturing the display panel DP according to an exemplary embodiment of the present inventive concepts. The process of forming a portion of the circuit layer DP-CL may include: a process S10 of forming the preliminary metal layer MP-P; a process S20 of forming the preliminary oxide layer RP-P, a process S30 of forming the preliminary capping layer CAP-P, and a process S40 of cleaning the preliminary electrode layer EL-P including the preliminary metal layer MP-P, the preliminary oxide layer RP-P, and the preliminary capping layer CAP-P. The process of forming the circuit layer DP-CL may also include: a process S50 of forming the photoresist layer pattern PT-P1 on the preliminary electrode layer EL-P; a process S60 of etching the preliminary electrode layer EL-P on which the photoresist layer pattern PT-P1 is formed; and a process S70 of removing the photoresist layer pattern PT-P1.

FIGS. 4 to 8 are cross-sectional views illustrating the process of forming a portion of the circuit layer DP-CL of the method of manufacturing the display panel DP according to an embodiment. The circuit layer DP-CL may include the first and sixth gates G1 and G6 (refer to FIG. 11), the first and sixth sources S1 and S6 (refer to FIG. 11), and the first and sixth drains D1 and D6 (refer to FIG. 11). The process includes forming the metal layer MP (refer to FIG. 8), the oxide layer RP (refer to FIG. 8), and the capping layer CAP (refer to FIG. 8), which are contained in at least one of the first and sixth gates G1 and G6 (refer to FIG. 11), the first and sixth sources S1 and S6 (refer to FIG. 11), and the first and sixth drains D1 and D6 (refer to FIG. 11). In FIGS. 4 to 8, components are enlarged for convenience of illustration and sizes of each of the components may vary from the exemplary embodiments shown in FIGS. 4-8.

Figure 4:
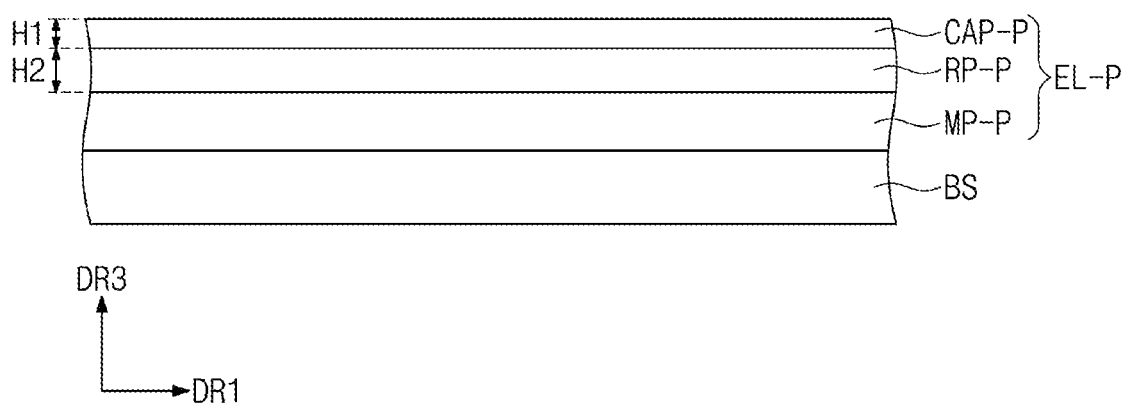
FIG. 4 is a cross-sectional view illustrating the method of manufacturing the display panel according to an exemplary embodiment of the present inventive concepts.

FIG. 4 illustrates the process S10 of forming the preliminary metal layer MP-P, the process S20 of forming the preliminary oxide layer RP-P, and the process S30 of forming the preliminary capping layer CAP-P. As shown in the exemplary embodiment of FIG. 4, the preliminary metal layer MP-P, the preliminary oxide layer RP-P, and the preliminary capping layer CAP-P are disposed on the base substrate BS. For example, the preliminary metal layer MP-P, the preliminary oxide layer RP-P, and the preliminary capping layer CAP-P may be sequentially disposed on the base substrate BS. FIG. 4 illustrates that the preliminary metal layer MP-P, the preliminary oxide layer RP-P, and the preliminary capping layer CAP-P are sequentially formed on the base substrate BS in the third direction DR3. However, exemplary embodiments of the present inventive concepts are not limited thereto. For example, in another exemplary embodiment, the preliminary metal layer MP-P, the preliminary oxide layer RP-P, and the preliminary capping layer CAP-P may be sequentially provided on a separate substrate or on a layer instead of the base substrate BS, such as an intermediate layer, etc.

According to an exemplary embodiment, the preliminary metal layer MP-P may have a single layer structure or a multilayer structure. For example, the single layer structure may include at least one metal selected from copper (Cu) and aluminum (Al). In an exemplary embodiment, the multilayer structure may include copper (Cu)/titanium (Ti), Al/Ti or Ti/Al/Ti. However, exemplary embodiments of the present inventive concepts are not limited thereto.

In an exemplary embodiment, the preliminary oxide layer RP-P may include a molybdenum oxide and a tantalum oxide. The preliminary oxide layer RP-P may be formed from a mixture of the molybdenum oxide and the tantalum oxide. The molybdenum oxide in the preliminary oxide layer RP-P may prevent external light reflection and the tantalum oxide in the preliminary oxide layer RP-P may prevent the molybdenum oxide from being exposed to deionized water DW in the cleaning process S40 (refer to FIG. 3), which will be described later.

In an exemplary embodiment, the preliminary oxide layer RP-P may include molybdenum and tantalum, and a content ratio of the molybdenum and the tantalum may be in a range of about 94:6 at % to about 98:2 at %. For example, content ratio of the molybdenum and the tantalum may be about 94:6 at %, or about 96:4 at %. The content ratio of the molybdenum and the tantalum is obtained by comparing an atomic content ratio of the molybdenum and the tantalum. When the content ratio of the molybdenum and the tantalum is about 94:6 at %, the molybdenum has about 94 at %, and the tantalum has about 6 at %. In this specification, the term at % means an atomic percent.

In an exemplary embodiment, the preliminary oxide layer RP-P may include $MoO_2$ and TaO. However, exemplary embodiments of the present inventive concepts are not limited thereto and different oxides of molybdenum and/or tantalum may be used in other exemplary embodiments.

The tantalum content may be a factor that changes a removal speed $ER_1$ of the preliminary oxide layer RP-P in the process S60 of etching the preliminary oxide layer in the etching process S60 of the preliminary electrode layer EL-P that will be described later. In an exemplary embodiment, each of the preliminary oxide layer RP-P and the oxide layer RP may have a thickness H2 in a range of about 100 Å to about 1500 Å. When the thicknesses H2 of the preliminary oxide layer RP-P and the oxide layer RP are greater than about 1500 Å, a tip may be formed in the etching process S60. When the tip is formed, a defect may be generated in a following process. The etching process S60 of the preliminary electrode layer EL-P will be described in more detail with reference to FIG. 7.

According to an exemplary embodiment, the preliminary capping layer CAP-P may include at least one compound selected from AZO, GZO, ITZO, IZO, ZIO, and ZTO. The preliminary capping layer CAP-P may have an amorphous characteristic of AZO, GZO, ITZO, IZO, ZIO, and ZTO. In an exemplary embodiment, the preliminary capping layer CAP-P may have a transmittance of about 90% or more in a region having a wavelength equal to or greater than about 400 nm and equal to or less than about 800 nm. For example, the preliminary capping layer CAP-P may be optically transparent in a visible light region. In an exemplary embodiment, the preliminary capping layer CAP-P may have a mean reflectivity of about 20% or less in a wavelength region in a range of about 400 nm to about 800 nm. In an exemplary embodiment, the preliminary capping layer CAP-P may have a thickness H1 in a range of about 100 Å or more and about 1000 Å or less.

Figure 5:
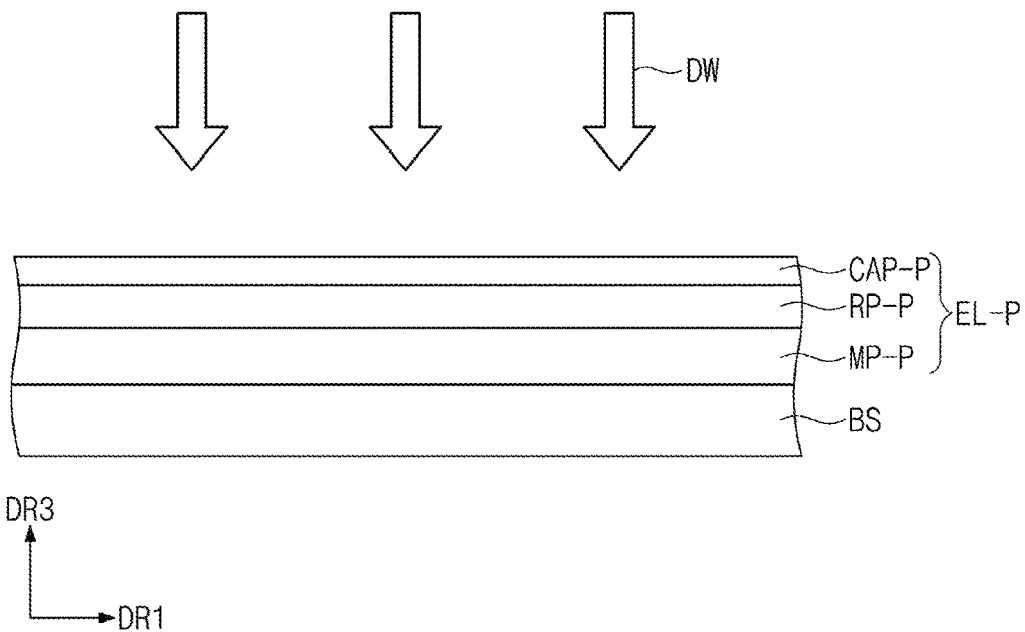
FIG. 5 is a cross-sectional view illustrating the method of manufacturing the display panel according to an exemplary embodiment of the present inventive concepts.

FIG. 5 illustrates the process S40 of cleaning the preliminary electrode layer EL-P of FIG. 3 according to an exemplary embodiment of the present inventive concepts. FIG. 5 illustrates the process S40 of cleaning by providing deionized water DW to the preliminary electrode layer EL-P that includes the preliminary metal layer MP-P, the preliminary oxide layer RP-P, and the preliminary capping layer CAP-P. The cleaning process S40 may remove impurities present on the preliminary electrode layer EL-P.

Figure 6:
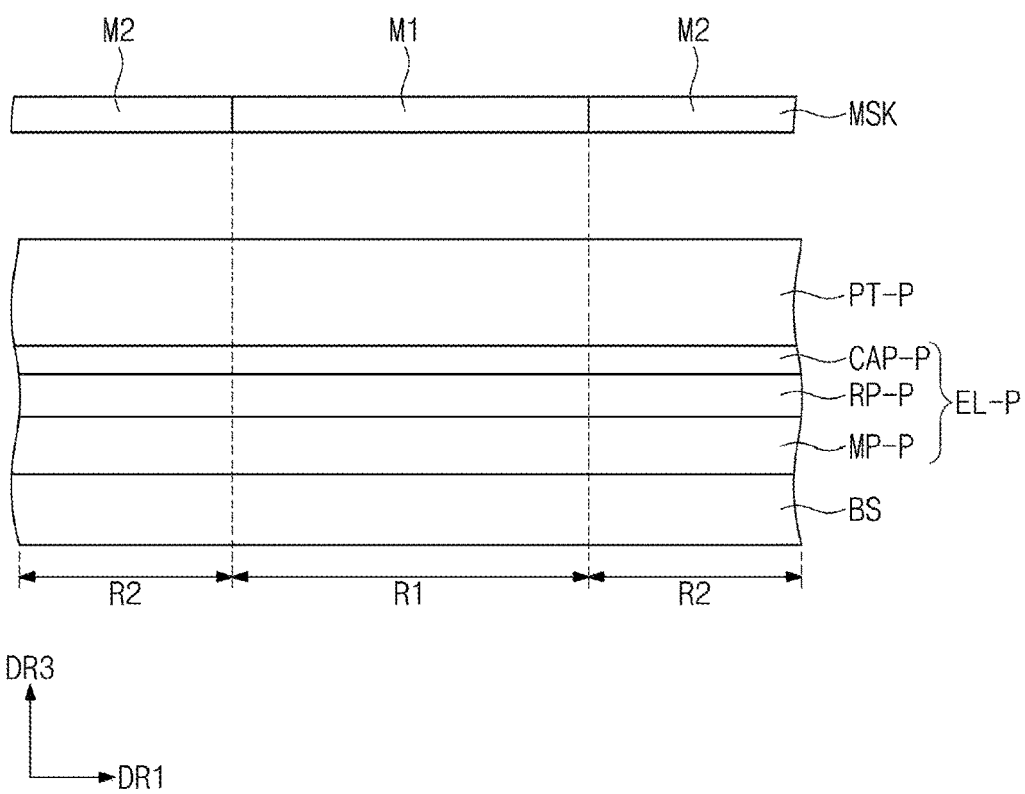
FIG. 6 is a cross-sectional view illustrating the method of manufacturing the display panel according to an exemplary embodiment of the present inventive concepts.

In an exemplary embodiment, the preliminary oxide layer RP-P includes molybdenum and tantalum, such as a molybdenum oxide and a tantalum oxide, and the molybdenum oxide dissolves in the deionized water DW when exposed thereto. The preliminary capping layer CAP-P may be disposed on the preliminary oxide layer RP-P to prevent the preliminary oxide layer RP-P from being exposed to the deionized water DW. For example a lower surface of the preliminary capping layer CAP-P may directly contact an upper surface of the preliminary oxide layer RP-P to prevent exposure to the deionized water DW. Since the preliminary capping layer CAP-P is optically transparent in the visible light region as described above, an improvement effect of the external light reflectivity of the oxide layer RP formed from the preliminary oxide layer RP-P may be maintained, FIG. 6 illustrates the process S50 of forming the photoresist layer pattern PT-P1 on the preliminary electrode layer EL-P of FIG. 3, A photoresist layer PT-P may be formed on a front surface of the preliminary electrode layer EL-P and then exposed through a mask MSK. For example, as shown in the exemplary embodiment of FIG. 6, a lower surface of the photoresist layer PT-P may directly contact an upper surface of the preliminary capping layer CAP-P.

The mask MSK may include a first portion M1 transmitting only a partial portion of light and blocking a partial portion of light and a second portion M2 blocking all of irradiated light. For example, as shown in the exemplary embodiment of FIG. 6, the first portion M1 and the second portion M2 of the mask MSK may be spaced apart in a first direction DR1 that is parallel to an upper surface of the base substrate BS. For example, the first portion M1 may be positioned on a central portion (e.g., in the first direction DR1) of the mask MSK and the second portion M2 may be disposed on lateral ends (e.g., in the first direction DR1) of the first portion M1. The base substrate BS and the preliminary electrode layer EL-P may be divided into a first area R1 and a second area R2, which correspond to the first portion M1 and the second portion M2, respectively. For example, the first area. R1 and the second area R2 may overlap the first portion M1 and the second portion M2, respectively, in the third direction DR3.

Thereafter, the photoresist layer PT-P exposed through the first portion M1 of the mask MSK is developed. A photoresist layer pattern PT-P1 having a predetermined thickness is formed in the second area R2 in which light is blocked by the mask MSK. The photoresist layer is completely removed from the first area R1 in which light is transmitted through the first portion M1 to expose a surface of the preliminary electrode layer EL-P as illustrated in the exemplary embodiment of FIG. 7. For example, an upper surface of the preliminary capping layer CAP-P may be exposed by the removal of the photoresist layer in the first area R1. Although the exemplary embodiments of FIGS. 6-7 include a positive photoresist in which a photoresist layer at an exposed portion is removed is exemplarily described in FIGS. 6 and 7, exemplary embodiments of the present inventive concepts are not limited thereto. For example, in another exemplary embodiment, a negative photoresist may be used so that the portion of the photoresist layer PT-P that is not exposed to light transmitted through the mask MSK is removed. In this exemplary embodiment, the positioning of the first portion M1 and second portion M2 of the mask MSK may be opposite to the positioning thereof in the exemplary embodiment that uses a positive photoresist.

The preliminary electrode layer EL-P may then be patterned by using the photoresist layer pattern PT-P1 as a mask layer for patterning the preliminary electrode layer EL-P. For example, as illustrated in the exemplary embodiment of FIG. 7, an etching solution may be provided on the preliminary electrode layer EL-P and the portion of the preliminary electrode layer EL-P on which the photoresist layer pattern PT-P1 is not formed may be etched by the etching solution. The portions of the preliminary electrode layer EL-P overlapping the photoresist pattern PT-P1 (e.g., in the third direction DR3) may not be etched by the etching solution, Thereafter, as illustrated in the exemplary embodiment of FIG. 8, the metal layer MIP, the oxide layer RP, and the capping layer CAP may be formed from the respective portions of the preliminary metal layer MP-P, the preliminary oxide layer RP-P and the preliminary capping layer CAP-P which overlapped the photoresist pattern PT-P1 in the third direction DR3 and were not etched by the etching solution.

Figure 7:
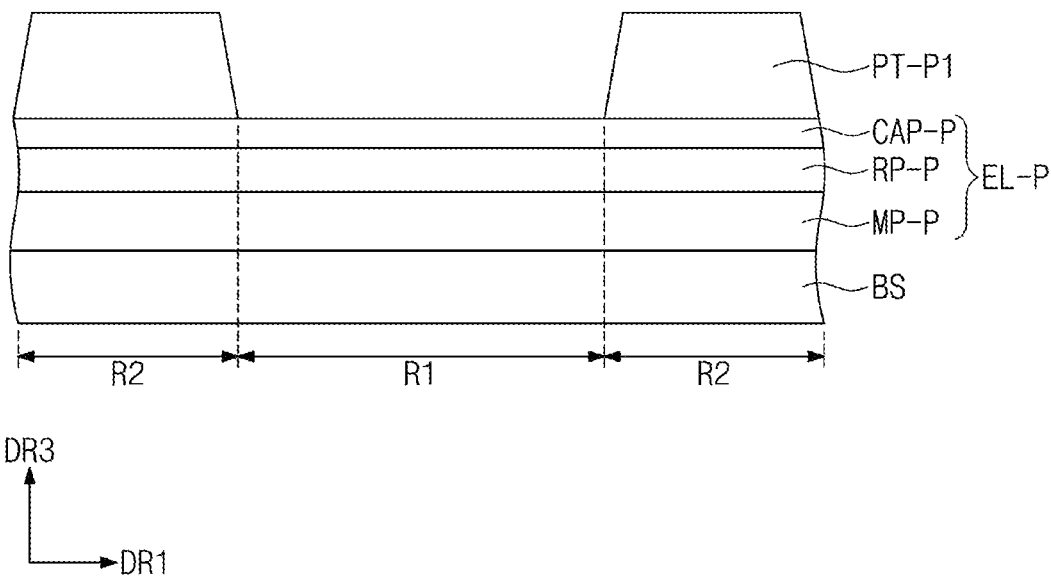
FIG. 7 is a cross-sectional view illustrating the method of manufacturing the display panel according to an exemplary embodiment of the present inventive concepts.

FIG. 7 illustrates the process S60 of etching the preliminary electrode layer EL-P on which the photoresist layer pattern PT-P1 in FIG. 3 is formed. In an exemplary embodiment, a non-hydro-peroxide etching solution may be used in the etching process S60.

In an exemplary embodiment, the etching process S60 may be performed through a wet process. In this exemplary embodiment, an isotropic etching is performed. The isotropic etching represents that etching is performed equally in all directions. However, exemplary embodiments of the present inventive concepts are not limited thereto.

A removal speeds $ER_1$ of the preliminary oxide layer RP-P and a removal speed $ER_2$ of the preliminary metal layer MP-P in the etching process S60 may satisfy the relationship of Equation 1.

$$1 \leq ER_2/ER_1 \leq 3 \quad \text{[Equation 1]}$$

In Equation 1, terms $ER_1$ and $ER_2$ may represent the removal speeds of the preliminary oxide layer RP-P and the preliminary metal layer MP-P in the same unit area, respectively. The removal speeds may represent removed lengths of the preliminary oxide layer RP-P and the preliminary metal layer MP-P per unit time.

For example, the removal speed $ER_2$ of the preliminary metal layer MP-P may be less than or equal to three times (e.g., ≤300%) the removal speed $ER_1$ of the preliminary oxide layer RP-P and greater than or equal to (e.g., ≥100%) the removal speed $ER_1$ of the preliminary oxide layer RP-P.

When the removal speed $ER_1$ of the preliminary oxide layer RP-P increases to a value that is greater than the removal speed $ER_2$ of the preliminary metal layer MP-P, the preliminary oxide layer RP-P may not provide a low external light reflectivity. The removal speed $ER_1$ of the preliminary oxide layer RP-P may increase as a content of tantalum decreases, or the external light reflectivity may be reduced when the content of tantalum is low.

When the removal speed $ER_1$ of the preliminary oxide layer RP-P decreases to a value less than one-third of the removal speed $ER_2$ of the preliminary metal layer MP-P, a tip may be formed at an edge of the preliminary oxide layer RP-P due to a difference between the removal speeds $ER_1$ and $ER_2$ of the preliminary oxide layer RP-P and the preliminary metal layer MP-P. The forming of the tip may cause a limitation such as short-circuit in a following process. For example, when a process of injecting a solution is performed in the following process, the solution may be injected to a portion at which the tip is formed, and this may cause a short-circuit.

As described above, the removal speed $ER_1$ of the preliminary oxide layer RP-P may be varied according to the content of tantalum. When a content ratio of the molybdenum and the tantalum in the preliminary oxide layer RP-P is in a range of about 94:6 at % to about 98:2 at %, the removal speeds $ER_1$ and $ER_2$ of the preliminary oxide layer RP-P and the preliminary metal layer MP-P may satisfy the relationship of Equation 1. For example, when the content ratio of the molybdenum and the tantalum is greater than about 94:6, the tip may be formed at an edge of the preliminary oxide layer RP-P due to a difference between the removal speeds $ER_1$ and $ER_2$ of the preliminary oxide layer RP-P and the preliminary metal layer MP-P. For example, when the content of tantalum is greater than about 6 at %, the tip may be formed at the edge of the preliminary oxide layer RP-P. In an exemplary embodiment, the process S70 of removing the photoresist layer pattern PT-P1 of FIG. 3 may be performed after the etching process S60.

Although each of the preliminary capping layer CAP-P and the capping layer CAP contacts only one surface (e.g., an upper surface) of each of the preliminary oxide layer RP-P and the oxide layer RP in the exemplary embodiments of FIGS. 4 to 8, exemplary embodiments of the present inventive concepts are not limited thereto. For example, in an exemplary embodiment, the capping layer CAP may cover the oxide layer RP and the metal layer MP. For example, the capping layer CAP may cover a layer disposed therebelow, such as lateral side surfaces of the metal layer MP and upper and lateral side surfaces of the oxide layer RP. However, exemplary embodiments of the present inventive concepts are not limited thereto. In an exemplary embodiment, an additional process for covering a lateral side surface of each of the oxide layer RP and the metal layer MP by the capping layer CAP may be performed after the process S70 of removing the photoresist layer pattern PT-P1.

The metal layer MP manufactured from the preliminary metal layer MP-P may include the above-described properties of the preliminary metal layer MP-P. The oxide layer RP manufactured from the preliminary oxide layer RP-P may include the above-described properties of the preliminary oxide layer RP-P. Also, the capping layer CAP manufactured from the preliminary capping layer CAP-P may include the above-described properties of the preliminary capping layer CAP-P.

Figure 9:
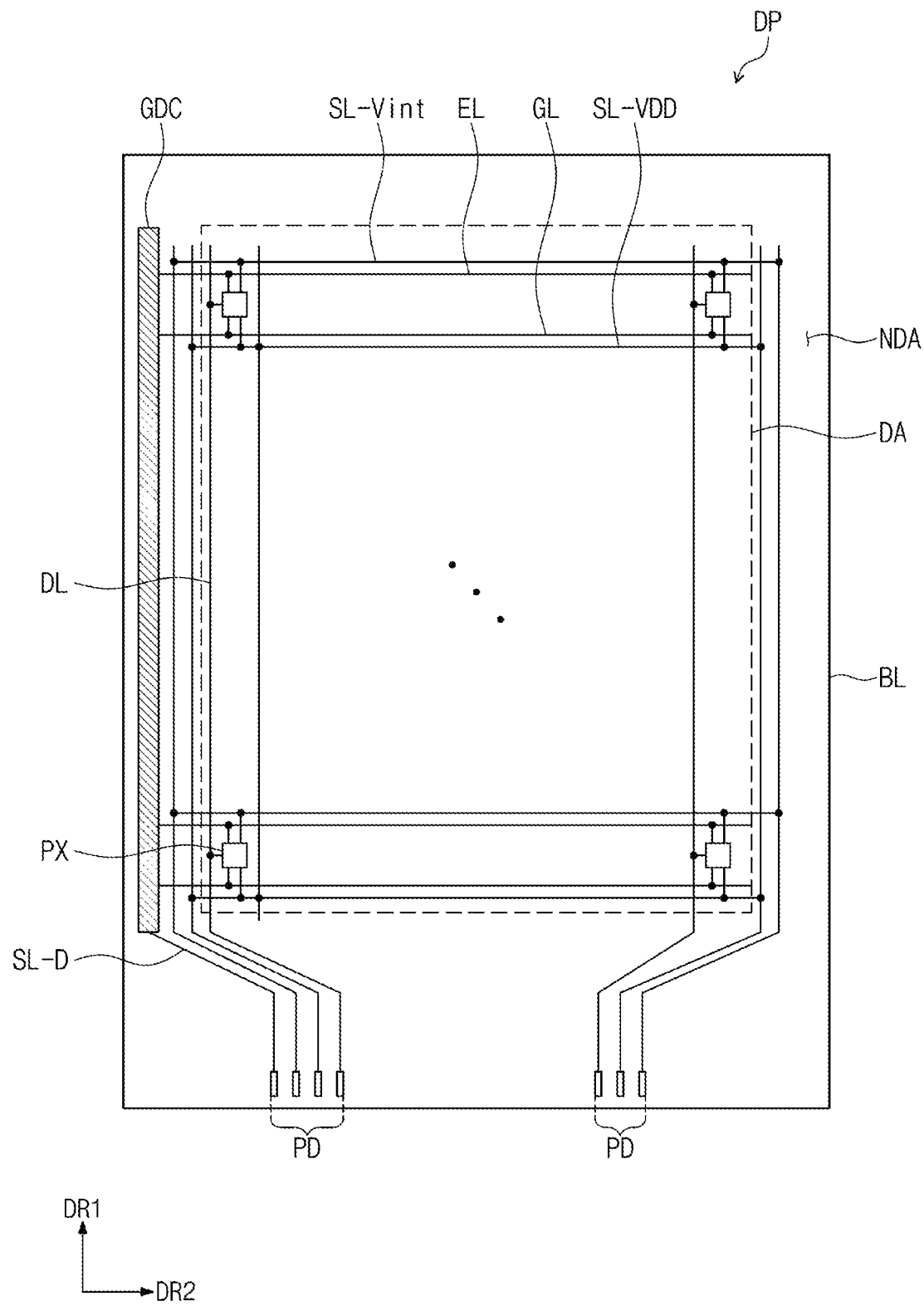
FIG. 9 is a plan view illustrating a display panel according to an exemplary embodiment of the present inventive concepts.

FIG. 9 is a schematic plan view illustrating the display panel DP according to an exemplary embodiment of the present inventive concepts. The display panel DP may include a display area. DA and a non-display area NDA on a plane defined in the first direction DR1 and a second direction DR2 perpendicular to the first direction and the third direction DR3. Although the light emitting element layer DP-OLED of the display panel in the exemplary embodiment of FIG. 9 includes an organic electroluminescent element, exemplary embodiments of the present inventive concepts are not limited thereto.

The display panel DP may include a driving circuit GDC, a plurality of signal lines, such as an initialization voltage line SL-Vint, a power line SL-VDD, light emitting control lines EL, scan lines GL, data lines DL, and a dummy signal line SL-D, a power electrode, and a plurality of pixels PX. An area on which the plurality of pixels PX are disposed may be defined as the display area DA.

The circuit layer DP-CL may include the plurality of signal lines, such as an initialization voltage line SL-Vint, a power line SL-VDD, light emitting control lines EL, scan lines GL, data lines DL, and a dummy signal line SL-D. However, exemplary embodiments of the present inventive concepts are not limited thereto and one or more of these signal lines may be omitted from the plurality of signal lines.

The driving circuit GDC may include a scan driving circuit GDC. The scan driving circuit GDC may generate a plurality of scan signals and sequentially output the plurality of scan signals to a plurality of scan lines GL. The scan driving circuit GDC may also generate a plurality of light emitting control signals and output the plurality of light emitting control signals to a plurality of light emitting control lines EL.

The scan driving circuit GDC may be contained in the circuit layer DP-CL. The scan driving circuit GDC may include a plurality of thin-film transistors provided through the same process as the driving circuit of the pixel PX.

The plurality of signal lines, such as the scan lines GL, light emitting control lines EL, data lines DL, and a power line SL-VDD, an initialization voltage line SL-Vint, and a dummy signal line SL-D, may be contained in the circuit layer DP-CL, and a portion of the plurality of signal lines may be omitted. Pads PD may be connected to ends of the plurality of signal lines respectively. As shown in the exemplary embodiment of FIG. 9, the pads PD may be located in a portion of the non-display area NDA.

Each of the scan lines GL is connected to a corresponding pixel PX of the plurality of pixels, and each of the data lines DL is connected to a corresponding pixel PX of the plurality of pixels. Each of the light emitting control lines EL may be arranged in parallel to a corresponding scan line of the scan lines GL.

Figure 10:
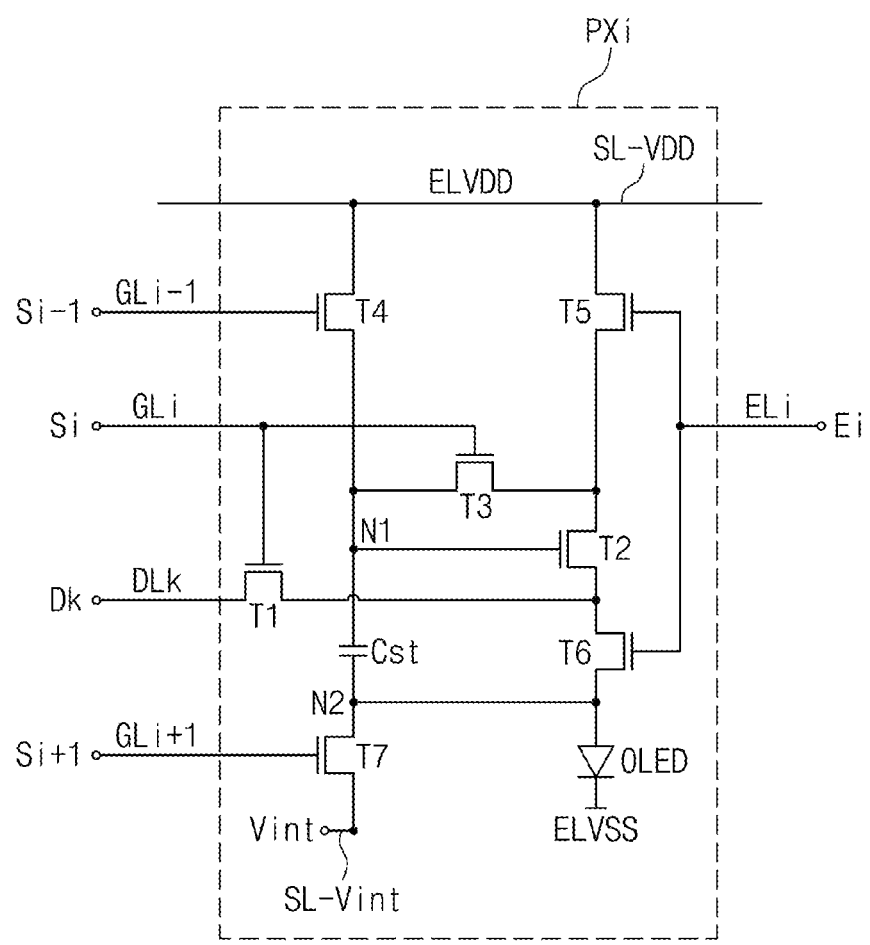
FIG. 10 is an equivalent circuit diagram of a pixel according to an exemplary embodiment of the present inventive concepts.

FIG. 10 exemplarily illustrates an i-th pixel PXi connected to a k-th data line DLk of the plurality of data lines DL1 to DLm. The i-th pixel PXi is activated in response to an i-th scan signal Si applied to an i-th scan line GLi.

The i-th pixel PXi may include a pixel driving circuit controlling a light emitting element OLED. The pixel driving circuit may include seven thin-film transistors including first to seventh transistors T1 to T7 and one capacitor Cst. Although the pixel driving circuit in the exemplary embodiment of FIG. 10 includes seven thin-film transistors including first to seventh transistors T1 to T7 and the one capacitor Cst exemplary embodiments of the present inventive concepts are not limited thereto and the pixel driving circuit including the numbers of the transistors and the capacitor may be variously changed in other exemplary embodiments.

A driving transistor may control a driving current supplied to the light emitting element OLED. An output electrode of the second transistor T2 may be electrically connected to the organic light emitting element OLED. The output electrode of the second transistor T2 may pass through the sixth transistor T6 and be connected to the organic light emitting element OLED.

The sixth transistor T6 may be connected between an output electrode of the first transistor T1 and a first electrode EL1 (refer to FIG. 11) that is an anode electrode of the organic light emitting element OLED. A control electrode of the sixth transistor T6 may be connected to an i-th light emitting control line ELi.

A control electrode of a control transistor may receive a control signal. A control signal applied to the i-th pixel PXi may include an i−1-th scan signal Si−1, an i-th scan signal Si, an i+1-th scan signal Si+1, a data signal Dk, and an i-th light emitting control signal Ei. The control transistor may include a first transistor T1 and third to seventh transistors T3 to T7.

The first transistor T1 may include a sensing electrode connected to a k-th data line DLk, a control electrode connected to the i-th scan line GLi, and an output electrode connected to the output electrode of the second transistor T2. The first transistor T1 may be turned on by the scan signal Si (hereinafter, referred to as an i-th scan signal) applied to the i-th scan line GLi and provide a data signal Dk, which is applied to the k-th data line DLk, to the storage capacitor Cst.

FIG. 11 is a cross-sectional view of a display panel DP-1 according to an exemplary embodiment of the present inventive concepts, illustrating a circuit layer DP-CL including first and sixth transistors T1 and T6 and a light emitting element layer DP-OLED.

At least one inorganic layer may be disposed on a base substrate BS. In an exemplary embodiment, the inorganic layer may include at least one compound selected from an aluminum oxide, a titanium oxide, a silicon oxide, a silicon oxynitride, a zirconium oxide, and a hafnium oxide. The inorganic layer may have one layer or multiple layers. The multilayered inorganic layers may include a barrier layer and/or a buffer layer. In the exemplary embodiment of FIG. 11, a buffer layer BFL having a single layer is disposed on the base substrate BS. For example, a lower surface of the buffer layer BFL is disposed on an upper surface of the base substrate BS.

Referring to the exemplary embodiment of FIG. 11, the first transistor T1 and the sixth transistor T6 may include a first and sixth gate G1 and G6, a first and sixth source S1 and S6, a first and sixth active A1 and A6, and a first and sixth drain D1 and D6, respectively. The first and sixth sources S1 and S6 and the first and sixth drains D1 and D6 may extend in opposite directions with respect to the first and sixth active A1 and A6 (e.g., in the second direction DR2), respectively.

At least one of the first and sixth gates G1 and G6, the first and sixth sources S1 and S6, and the first and sixth drains D1 and D6 may be provided by the above-described method of manufacturing the display panel DP according to an exemplary embodiment of the present inventive concepts. For example, at least one of the first and sixth gates G1 and G6, the first and sixth sources S1 and S6, and the first and sixth drains D1 and D6 may include the metal layer MP (refer to FIG. 8), the oxide layer RP (refer to FIG. 8), and the capping layer CAP (refer to FIG. 8). Also, at least one of the first and sixth gates G1 and G6, the first and sixth sources S1 and S6, and the first and sixth drains D1 and D6 may include the above-described properties of the metal layer MP, the oxide layer RP, and the capping layer CAP.

A first intermediate insulation layer 10 may be disposed on the buffer layer BFL. For example, as shown in the exemplary embodiment of FIG. 11, a lower surface of the first intermediate insulation layer 10 directly contacts upper surfaces of the buffer layer BFL, the first and sixth drains D1, D6, the first and sixth sources S1, S6 and the first and sixth actives A1, A6, The first intermediate insulation layer 10 may be an inorganic layer and/or an organic layer and have a single-layer or multilayer structure. In an exemplary embodiment, the first intermediate insulation layer 10 may include at least one compound selected from an aluminum oxide, a titanium oxide, a silicon oxide, a silicon oxynitride, a zirconium oxide, and a hafnium oxide. For example, the first intermediate insulation layer 10 may be a single layered silicon oxide layer. In an exemplary embodiment, an insulation layer of the circuit layer DP-CL, which will be described later, may be an inorganic layer, an organic layer, or a composite layer and may have a single-layer or multi-layer structure like the first intermediate insulation layer 10. The inorganic layer may include at least one of the above-described materials.

The first and sixth gates G1 and G6 are disposed on the first intermediate insulation layer 10. In an exemplary embodiment, the first gate G1 may be a portion of the metal pattern. However, exemplary embodiments of the present inventive concepts are not limited thereto. The first and sixth gates G1 and G6 may overlap the first and sixth actives A1 and A6 (e.g., in the third direction DR3), respectively.

A second intermediate insulation layer 20 for covering the gate G1 and G6 may be disposed on the first intermediate insulation layer 10. For example, as shown in the exemplary embodiment of FIG. 11, a lower surface of the second intermediate insulation layer 20 may directly contact an upper surface of the first intermediate insulation layer 10.

A first connection electrode SD1 may be disposed on the second intermediate insulation layer 20. As shown in the exemplary embodiment of FIG. 11, the first connection electrode SD1 may be connected to the sixth drain D6 through a first contact hole CNT-1 extending through the second intermediate insulation layer 20 and the first intermediate insulation layer 10.

A first insulation layer 30 is disposed on the second intermediate insulation layer 20. For example, as shown in the exemplary embodiment of FIG. 11, a lower surface of the first insulation layer 30 may directly contact an upper surface of the second intermediate insulation layer 20. The first insulation layer 30 may be an organic layer. A second connection electrode SD2 may be disposed on the first insulation layer 30. The second connection electrode SD2 may be connected to the first connection electrode SD1 through a second contact hole CNT-2 passing through the first insulation layer 30.

A second insulation layer 40 covering the second connection electrode SD2 is disposed on the first insulation layer 30. For example, as shown in the exemplary embodiment of FIG. 11, a lower surface of the second insulation layer 40 may directly contact an upper surface and lateral side surfaces of the second connection electrode SD2 and an upper surface of the first insulation layer 30. In an exemplary embodiment, the second insulation layer 40 may be an organic layer. A first electrode EL1 is disposed on the second insulation layer 40. As shown in the exemplary embodiment of FIG. 11, the first electrode EL1 may be connected to the second connection electrode SD2 through a third contact hole CNT-3 passing through the second insulation layer 40.

The light emitting element layer DP-OLED may be disposed on the circuit layer DP-CL. For example, as shown in the exemplary embodiment of FIG. 11, a lower surface of the light emitting element layer DP-OLED may directly contact an upper surface of the circuit layer DP-CL. In an exemplary embodiment, the light emitting element layer DP-OLED may include a light emitting element OLED and a pixel defining layer PDL distinguishing the light emitting element OLED. As shown in the exemplary embodiment of FIG. 11, the pixel defining layer PDL may be disposed directly on the second insulation layer 40 and the first electrode EL1 and may cover lateral surfaces (e.g., lateral ends in the second direction DR2) of the first electrode EL1. An opening OP may be defined by the pixel defining layer PDL.

The light emitting element OLED may include a first electrode EL1 and a second electrode EL2, which face each other and are spaced apart (e.g., in the third direction DR3), and a hole control layer HCL, a light emitting layer EML, and an electron control layer ECL, which are disposed between the first electrode EL1 and the second electrode EL2 (e.g., in the third direction DR3). A hole control layer HCL may be disposed on the first electrode EL1. For example, as shown in the exemplary embodiment of FIG. 11, the hole control layer HCL may be disposed directly on the first electrode EL1 (e.g., in the third direction DR3). The hole control layer HCL may further include a hole transporting layer and a hole injection layer. The light emitting layer EML may be disposed on the hole control layer HCL. For example, as shown in the exemplary embodiment of FIG. 11, the light emitting layer EML may be disposed directly on the hole control layer HCL (e.g., in the third direction DR3). The electron control layer ECL may be disposed on the light emitting layer EML. For example, as shown in the exemplary embodiment of FIG. 11, the electron control layer ECL may be disposed directly on the light emitting layer EML (e.g., in the third direction DR3). In an exemplary embodiment, the electron control layer ECL may include an electron transporting layer and an electron injection layer. The second electrode EL2 may be disposed on the electron control layer ECL. For example, as shown in the exemplary embodiment of FIG. 11, the second electrode EL2 may be disposed directly on the electron control layer ECL (e.g., in the third direction DR3). However, exemplary embodiments of the present inventive concepts are not limited thereto. For example, in another exemplary embodiment, the light emitting element OLED may include at least one additional separate layer or the arrangement of the layers may vary.

As shown in the exemplary embodiment of FIG. 11, a thin-film encapsulation layer TFE may be directly disposed on the second electrode EL2 (e.g., in the third direction DR3). The thin-film encapsulation layer TFE seals the light emitting element layer DP-OLED. In an exemplary embodiment, the thin-film encapsulation layer TFE may include at least one inorganic layer and at least one organic layer. For example, the thin-film encapsulation layer TEF may include at least two inorganic layers and one organic layer disposed therebetween (e.g., in the third direction DR3). The inorganic layers may protect the light emitting element layer DP-OLED from moisture/oxygen, and the organic layer may protect the light emitting element layer DP-OLED from foreign substances such as dust particles. In an exemplary embodiment, the inorganic layer may include a silicon nitride layer, a silicon oxynitride layer, and a silicon oxide layer, a titanium oxide layer, or an aluminum oxide layer. However, exemplary embodiments of the present inventive concepts are not limited thereto. Although in an exemplary embodiment, the organic layer may include an acrylic-based organic layer, exemplary embodiments of the present inventive concepts are not limited thereto.

Figure 12:
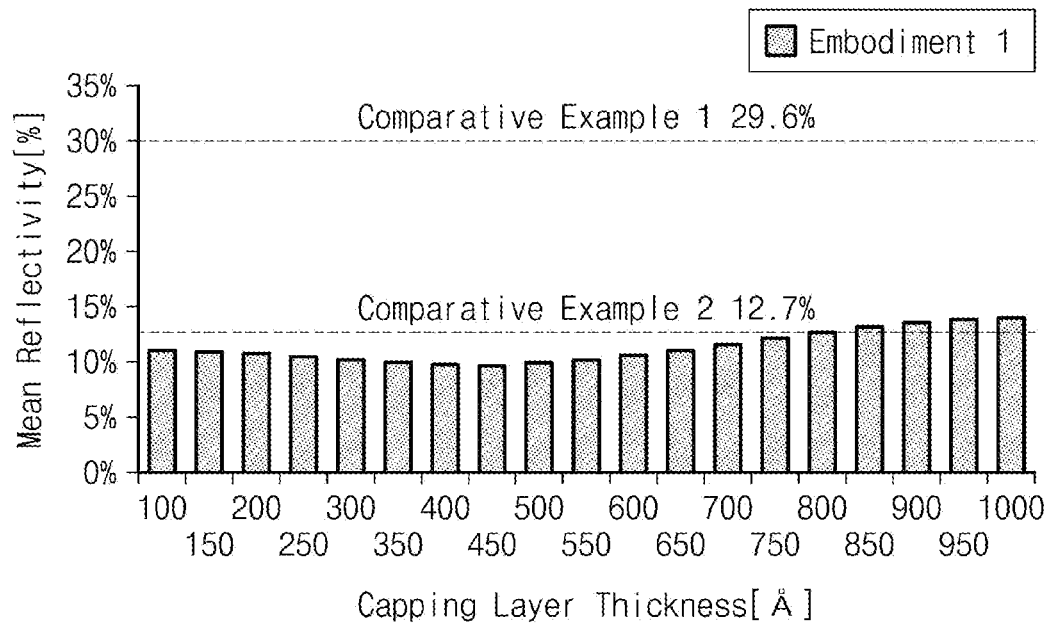
FIG. 12 is a graph representing a mean reflectivity according to whether a capping layer is contained and a variation of a thickness of the capping layer.

FIG. 12 is a graph representing measurement results of a mean reflectivity of a display panel according to a comparative example and an exemplary embodiment of the present inventive concepts. A comparative example 1 does not include an oxide layer RP and a capping layer CAP, and a comparative example 2 includes a metal layer MP and an oxide layer RP but does not include the capping layer CAP. Embodiment 1 according to an exemplary embodiment of the present inventive concepts includes the metal layer MP, the oxide layer RP, and the capping layer CAP. Embodiment 1 is measured while a thickness of the capping layer is varied.

The reflectivity is measured by using a spectrometer. The reflectivity of visible light in a wavelength region of about 400 nm to about 800 nm is measured.

Referring to the measurement results, a mean reflectivity of the Comparative Example 2 and Embodiment 1 is less than the Comparative Example 1. In Embodiment 1, the mean reflectivity is varied as the thickness of the capping layer CAP is varied. When the capping layer has a thickness in a range of about 100 Å to about 750 Å, the mean reflectivity is about 10% or less which is an excellent reflectivity property. In contrast, as shown in FIG. 12, the mean reflectivity of Comparative Example 1 is 29.6% and the mean reflectivity of Comparative Example 2 is 12.7%.

Figure 13:
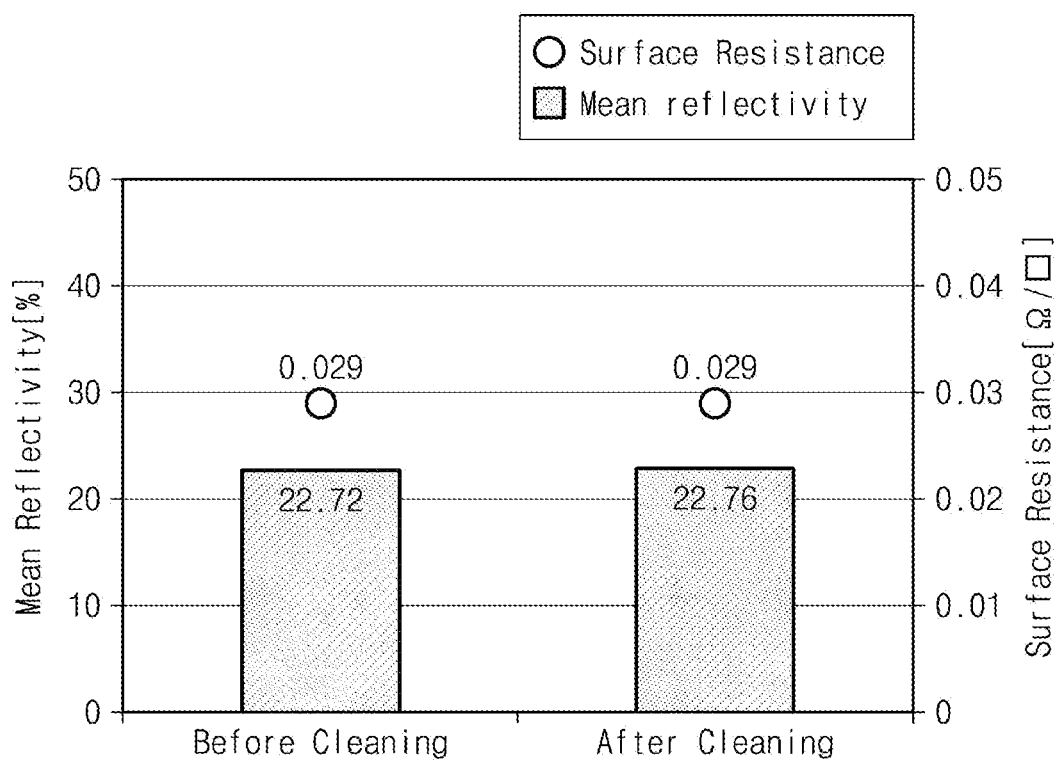
FIG. 13 is a graph obtained by comparing a mean reflectivity and a surface resistance before and after cleaning in the method of manufacturing the display panel according to an exemplary embodiment of the present inventive concepts.

FIG. 13 is a graph obtained by comparing a mean reflectivity and a surface resistance before and after a cleaning (e.g., S40 in FIG. 3) in the process of cleaning the preliminary electrode layer in the method of manufacturing the display panel according to an exemplary embodiment of the present inventive concepts. The surface resistance of the preliminary electrode layer is measured by using a 4 point probe, and the reflectivity is measured by using a spectrometer or an UV-vis spectrophotometer.

A difference between the mean reflectivity of the preliminary electrode layer before the cleaning (22.72%) and the mean reflectivity of the preliminary electrode layer after the cleaning (22.76%) is about 0.04%, and the surface resistance of the preliminary electrode layer shows the same value before and after the cleaning. The relatively minor increase in mean reflectivity from the cleaning is an effect of the capping layer CAP preventing the oxide layer from directly contacting the deionized water since the capping layer CAP is disposed on the oxide layer RP.

Figure 14:
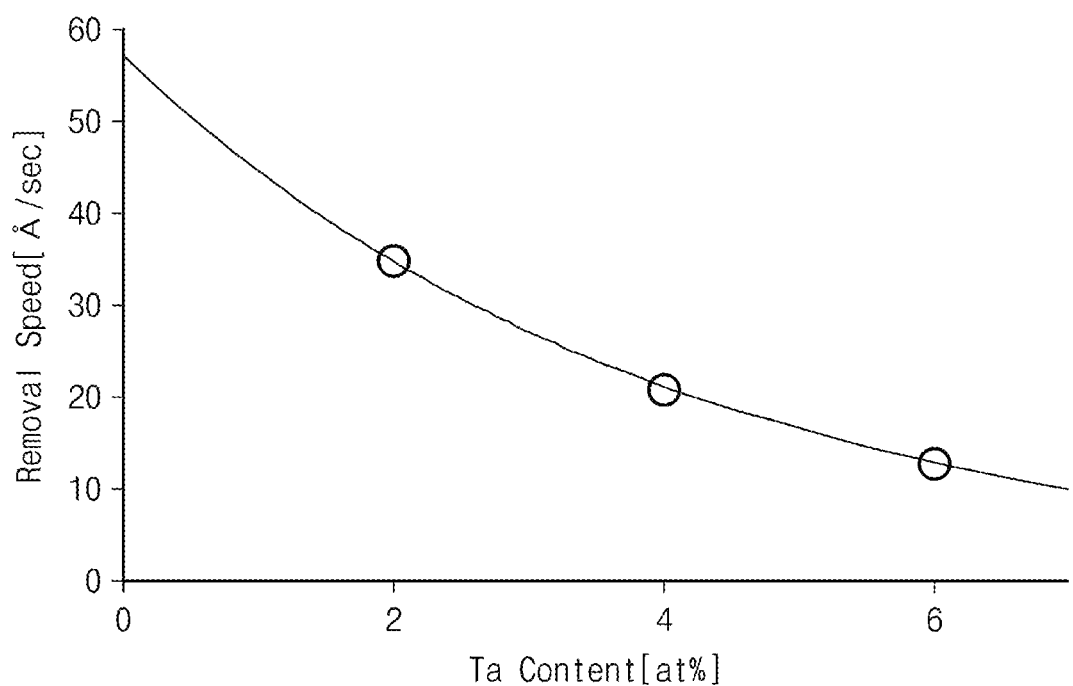
FIG. 14 is a graph representing a removal speed of an oxide layer based on a content of tantalum.

FIG. 14 is a graph representing a removal speed of the oxide layer in the etching process based on a content of tantalum. The removal speed is evaluated by using a phosphoric; acid/acetic acid/nitric acid-based etching solution in the wet process. Only the content of the tantalum of the content ratio between the molybdenum and the tantalum in the oxide layer is shown. When the content of the tantalum is about 2 at %, the content of the molybdenum is about 98 at %, (e.g., the content ratio of the molybdenum and tantalum is about 98:2 at %). When the content of the tantalum is about 4 at %, the content of the molybdenum is about 96 at % (e.g., the content ratio of the molybdenum and the tantalum is about 96:4 at %). When the content of the tantalum is about 6 at %, the content of the molybdenum is about 94 at % (e.g., the content ratio of the molybdenum and the tantalum is about 94.6 at %).

As described above, the content of tantalum may be a factor affecting the removal speed in the etching process (e.g., S60 in FIG. 3). Referring to FIG. 14, as the content of tantalum increases, the removal speed decreases.

TABLE 1

| Classification | Content of tantalum | | | Metal layer (Al) |
| --- | --- | --- | --- | --- |
| | 2 at % | 4 at % | 6 at % | |
| Removal speed | 35 Å/sec | 21 Å/sec | 13 Å/sec | about 30-40 Å/sec |

Table 1 represents the removal speed of the oxide layer RP shown in the graph of FIG. 14 and a removal speed of the metal layer MP. The oxide layer RP includes molybdenum and tantalum, and the metal layer MP include Al. The removal speed of each of the oxide layer RP and the metal layer MP is measured during the etching process. The removal speed of the metal layer MP is $ER_2$ in Equation 1, and the removal speed of the oxide layer RP is $ER_1$ in Equation 1 as described above. When the content of tantalum is greater than about 6 at % in FIG. 14, the removal speed may approach about 0. If the difference between removal speeds between the metal layer MP and the oxide layer RP in the etching process is greater than about 3 times, a tip may be formed at an edge of the oxide layer. When the tip is formed, a defect such as a short-circuit may be generated as described above.

The method of manufacturing the display panel according to an exemplary embodiment of the present inventive concepts may include a process of forming a preliminary metal layer, a preliminary oxide layer having an effect of improving a reflectivity, and a preliminary capping layer preventing the preliminary oxide layer from being directly contacted by other materials. The method may include a patterning and etching process after the process of forming the preliminary metal layer, the preliminary oxide layer and the preliminary capping layer. The removal speed of the oxide layer may be equal to or less than one-third of the removal speed of the metal layer in the etching process. Although the molybdenum oxide contained in the preliminary oxide layer has a dissolved property in the deionized water provided in the cleaning process, the preliminary capping layer may be provided on the preliminary oxide layer to prevent the molybdenum oxide from being dissolved by the deionized water.

The display panel according to an exemplary embodiment of the present inventive concepts may exhibit an improved external light reflectivity by including the metal layer, the oxide layer, and the capping layer according to the method of manufacturing the display panel in at least one of the gate, the source, and the drain of the circuit layer.

An exemplary embodiment of the present inventive concepts may provide the display panel including the oxide layer having the effect of improving the external light reflectivity on the metal layer and the capping layer protecting the oxide layer and the method of manufacturing the same. The method of manufacturing the display panel according to an exemplary embodiment of the present inventive concepts may exhibit the effect of minimizing damage to the oxide layer by including the capping layer on the oxide layer. In an exemplary embodiment, the display panel may maintain the external light reflectivity property by including the metal layer, the oxide layer, and the capping layer.

It will be apparent to those skilled in the art that various modifications and variations to the exemplary embodiments of the present inventive concepts may be made without departing from the present inventive concepts. Therefore, it is intended that the present inventive concepts cover the modifications and variations of the exemplary embodiments and the present inventive concepts are not limited thereto.

What is claimed is:
1. A display panel comprising:
   a base substrate;
   a circuit layer disposed on the base substrate and comprising a gate, a source, and a drain; and
   a light emitting element layer disposed on the circuit layer, wherein at least one of the gate, the source, and the drain comprises:

a metal layer;

an oxide layer disposed on the metal layer and comprising molybdenum and tantalum; and a capping layer disposed on the oxide layer and comprising at least one compound selected from AZO, GZO, ITZO IZO, ZIO, and ZTO.

2. The display panel of claim 1, wherein a content ratio of the molybdenum and the tantalum in the oxide layer is in a range of about 94:6 at % to about 98:2 at %.

3. The display panel of claim 1, wherein the oxide layer comprises $MoO_2$ and TaO.

4. The display panel of claim 1, wherein the capping layer has a mean reflectivity of about 20% or less in a wavelength region in a range of about 400 nm to about 800 nm.

5. The display panel of claim 1, wherein the capping layer has a thickness in a range of about 100 Å to about 1000 Å.

6. The display panel of claim 1, wherein the capping layer has a transmittance of about 90% or more in a wavelength region in a range of about 400 nm to about 800 nm.

7. The display panel of claim 1, wherein the at least one compound selected from AZO, GZO, ITZO, IZO, ZIO, and ZTO is an amorphous conductive metal oxide.

8. The display panel of claim 1, wherein the oxide layer has a thickness in a range of about 100 Å to 1500 Å.

9. The display panel of claim 1, wherein the metal layer comprises:

a single layer including at least one compound selected from Cu or Al; or multilayers comprising Cu/Ti, Al/Ti, or Ti/Al/Ti.

\* \* \* \* \*